(12) United States Patent
Lemley et al.

(10) Patent No.: US 11,043,378 B2
(45) Date of Patent: Jun. 22, 2021

(54) SYSTEMS AND METHODS FOR INHIBITING DETECTIVITY, METAL PARTICLE CONTAMINATION, AND FILM GROWTH ON WAFERS

(71) Applicant: TOKYO ELECTRON LIMITED, Tokyo (JP)

(72) Inventors: Corey Lemley, Troy, NY (US); Richard Farrell, Seattle, WA (US); Hoyoung Kang, Guilderland, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 14 days.

(21) Appl. No.: 16/681,634

(22) Filed: Nov. 12, 2019

(65) Prior Publication Data
US 2020/0152453 A1 May 14, 2020

Related U.S. Application Data

(60) Provisional application No. 62/760,589, filed on Nov. 13, 2018.

(51) Int. Cl.
| | |
|---|---|
| *H01L 21/02* | (2006.01) |
| *C23C 16/455* | (2006.01) |
| *C23C 16/04* | (2006.01) |

(52) U.S. Cl.
CPC ........ *H01L 21/02348* (2013.01); *C23C 16/04* (2013.01); *C23C 16/45525* (2013.01);
(Continued)

(58) Field of Classification Search
CPC ......... H01L 21/02348; H01L 21/02334; H01L 21/0212; H01L 21/0228; H01L 21/306;
(Continued)

(56) References Cited

U.S. PATENT DOCUMENTS

| | | | |
|---|---|---|---|
| 6,776,094 B1 * | 8/2004 | Whitesides | B01L 3/5085 101/327 |
| 2005/0139940 A1 | 6/2005 | Patel et al. | |

(Continued)

OTHER PUBLICATIONS

Zhuang et al. ("Vapor-Phase Self-Assembled Monolayers for Anti-Stiction Applications in MEMS," Journal of Microelectromechanical Systems, vol. 16, No. 6, Dec. 2007) (Year: 2007).*

(Continued)

*Primary Examiner* — Yasser A Abdelaziez
(74) *Attorney, Agent, or Firm* — Oblon, McClelland, Maier & Neustadt, L.L.P.

(57) ABSTRACT

Methods for processing a substrate are provided. The method includes receiving a substrate. The substrate has a front side surface, a backside surface, and a side edge surface. The method also includes coating the front side surface, the backside surface and the side edge surface with a self-assembled monolayer and exposing an area of interest with actinic radiation. The actinic radiation causes a de-protection reaction within the self-assembled monolayer within the central region. The method also includes removing the self-assembled monolayer from the area of interest while the self-assembled monolayer remains on remaining surfaces of the substrate.

20 Claims, 8 Drawing Sheets

(52) U.S. Cl.
CPC ...... *H01L 21/0212* (2013.01); *H01L 21/0228* (2013.01); *H01L 21/02334* (2013.01)

(58) Field of Classification Search
CPC ... H01L 21/32; C23C 16/45525; C23C 16/04; C23C 16/047
See application file for complete search history.

(56) References Cited

U.S. PATENT DOCUMENTS

| | | | |
|---|---|---|---|
| 2007/0281492 A1 | 12/2007 | Chinn et al. | |
| 2015/0155179 A1 | 6/2015 | Jans et al. | |
| 2017/0330972 A1* | 11/2017 | Kloster | H01L 21/31133 |
| 2018/0002165 A1 | 1/2018 | Suvanto | |
| 2018/0366317 A1* | 12/2018 | Ke | H01L 21/02334 |
| 2019/0384161 A1* | 12/2019 | Mirkin | G03F 1/54 |

OTHER PUBLICATIONS

Korean Intellectual Property Office, The International Search Report and the Written Opinion for International application No. PCT/US2019/060870, dated Mar. 9, 2020, 13 pg.

\* cited by examiner

Method 2

Method 3

SYSTEMS AND METHODS FOR INHIBITING DETECTIVITY, METAL PARTICLE CONTAMINATION, AND FILM GROWTH ON WAFERS

CROSS-REFERENCE TO RELATED APPLICATIONS

This application claims the benefit of priority from U.S. Provisional Application No. 62/760,589 filed Nov. 13, 2018, the entire contents of which are incorporated herein by reference.

BACKGROUND OF THE INVENTION

This disclosure relates to microfabrication of semiconductor wafers. Silicon wafers are processed to made integrated circuits and other semiconductor devices. Semiconductor fabrication involves many different steps of depositing, growing, patterning, removal, and cleaning of wafers. Various different materials are added and removed or partially removed, while other materials remain. Various process controls attempt to prevent defectivity and contamination.

SUMMARY

In one aspect, the present disclosure relates to a method of processing a substrate. The method includes receiving a substrate, the substrate having a front side surface, a backside surface, and a side edge surface, coating the front side surface, the backside surface and the side edge surface with a self-assembled monolayer; exposing an area of interest with actinic radiation, the actinic radiation causing a de-protection reaction within the self-assembled monolayer within the central region; and removing the self-assembled monolayer from the area of interest while the self-assembled monolayer remains on remaining surfaces of the substrate.

In one aspect, the method of processing a substrate includes receiving a substrate, the substrate having a front side surface, a backside surface, and a side edge surface; coating a target region of the front side surface with a sacrificial film, the sacrificial film having a surface that prevents adhesion of specific materials to the target region; coating the front side surface, the backside surface and the side edge surface with a self-assembled monolayer, the self-assembled monolayer failing to adhere to the sacrificial film, the self-assembled monolayer being hydrophobic; and removing the sacrificial film from the target region of the front side surface.

In one aspect, the method of processing a substrate includes receiving a substrate, the substrate having a front side surface, a backside surface, and a side edge surface; coating a target region of the front side surface with a sacrificial film; coating the front side surface, the backside surface and the side edge surface with a self-assembled monolayer, the self-assembled monolayer being hydrophobic; and removing the sacrificial film from the target region of the front side surface, wherein removing the sacrificial film also removes the self-assembled monolayer that was attached to the sacrificial film resulting in the target region being free from the self-assembled monolayer.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

DETAILED DESCRIPTION

Figure 1A:
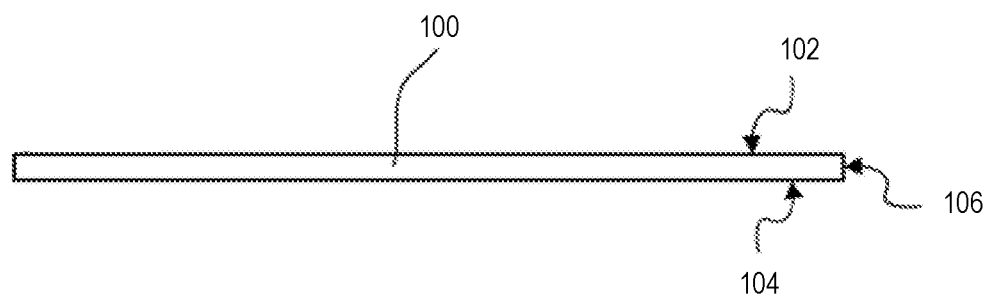
FIG. 1A is a schematic that shows a side view of a substrate according to one example.

Referring now to the drawings, wherein like reference numerals designate identical or corresponding parts throughout several views, the following description relates to a system and associated methodology for preventing contamination by using a self-assembled monolayer coating. Techniques described herein, however, provide coating processes that enable use of metal-containing materials while preventing contamination, defectivity, and unwanted film growth from these materials. Techniques include selectively applying and removing self-assembled monolayers (SAMs) as a blocking layer. Techniques can include controlling amount of SAM deposition as well as SAM removal.

Metal contamination on semiconductor wafers is a particular challenge when applying advanced photo-patternable materials and etch stop layers which contain metals. These metal-containing materials are useful to create high patterns on a wafer, as well as enabling three-dimensional logic, extreme ultraviolet lithography (EUV), and other advanced patterning schemes within optical lithography. Using metal-containing materials, however, is challenging because of a contamination potential.

There are single and multiple module approaches to limit metal contamination by selectively blocking adhesion of metal particles and metal-containing photo materials (e.g., photoresist, back anti-reflective coatings (BARC), metal hardmask (MHM) containing materials) by both additive and subtractive methods. Additional impact to this process attempts to provide a cleaner edge process to improve defectivity at wafer's edge and backside using conventional materials currently available for production.

Conventional techniques to control edge and backside defectivity are less effective in preventing material build up.

For example, an edge coat creating a sacrificial layer can have defectivity remaining on the wafer. Moreover, less-effective spin-on material coatings can result in an edge coat barrier, which can disrupt coating performance.

Figure 1B:
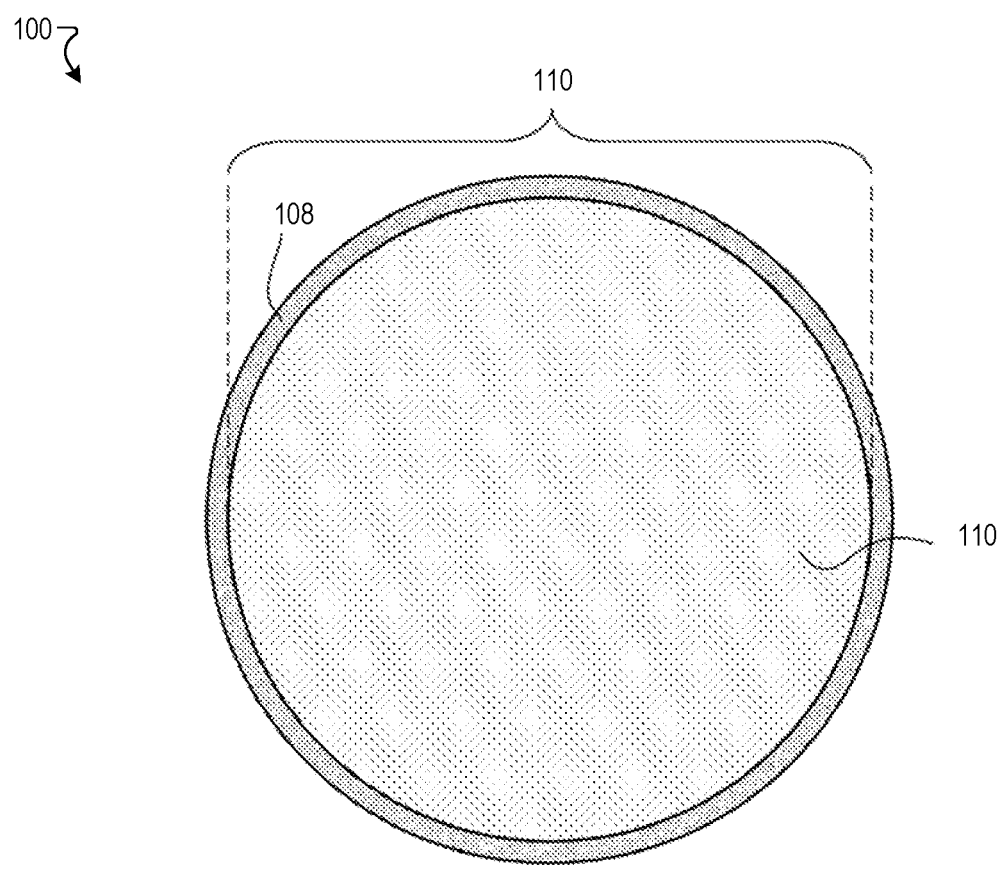
FIG. 1B is a schematic that shows a top view of the substrate according to one example.

FIG. 1A is a schematic that shows a side view of a substrate 100 according to one example. The substrate 100 can include a front side surface 102 (i.e., working surface), a backside surface 104, and a side edge surface 106. In one example, the substrate 100 is disc-shaped and relatively thin. A top view of the substrate 100 is shown in FIG. 1B. The edge region 108 of the front side surface 102 is an annular region extending from a perimeter of the front side surface a predetermined distance towards a center point of the front side surface. The predetermined distance may be in the range of 1 mm to 5 mm. This annular region or first annular region can be immediately adjacent to a perimeter of the substrate. The first annular region has a first outer perimeter proximate to the perimeter of the substrate and a first inner perimeter away from the perimeter of the substrate. In one example, the edge region 108 corresponds to a region where no active device is built.

Accordingly, techniques herein include methods of forming protective films on selected portions of a semiconductor substrate (wafer). In one embodiment, a particular SAM is coated on the substrate. This substrate can include a front side surface (working surface) and a backside surface, as well as a side edge surface as described previously herein. Typically such substrates are disc-shaped and relatively thin. An initial SAM coating is formed on the substrate. This initial SAM coating can cover all surfaces, that is, the front side, the backside, and side surfaces. Such a monomer coating can be applied, for example, using vapor deposition or other deposition techniques. By way of a non-limiting example, deposition conditions can be ambient temperature to 300 degrees Celsius in vacuum or atmosphere chambers. Deposition conditions can be adjusted outside of this range depending on a type of coating being applied and intended application. Reactions with halogens can form HCL, while reactions with OH can form water. After initial deposition of the SAM, the substrate can be rinsed to remove any unbound polymer or monomer material.

With a substrate fully coated, light is projected onto specific target areas. For example, typical substrates can have a working surface (front side surface) that is circular and planar. A projection target area can be a circle having a diameter smaller than an exterior diameter of the working surface, thereby leaving an exterior ring on the working surface that is not exposed to the actinic radiation. Exposure can be executed via mask-based or maskless projection systems. The SAM film can then be developed with a solvent or base depending on the composition of the selected SAM, or part of the molecule can be fractioned using light and leave as a small molecule under atmosphere or low pressure. Thus, the actinic exposure can lead to partial photo oxidation of the SAM molecules, which can then be washed away in a polar solvent.

Areas that were not exposed to actinic radiation can retain the complete SAM intact, and adhered to the substrate. These areas can include the backside surface, side surfaces, and peripheral edge of the front side surface. These areas thus remain hydrophobic. Portions of the substrate not covered by the SAM can then be hydrophilic, depending on physical properties of a particular substrate surface. The result is substrate that is protected except for an active area of interest on the working surface. Remaining surfaces of the substrate can be protected from ALD and CVD deposition, solvent wetting, de-ionized water wetting, as well as polymer adhesion. An initial ALD growth can be optimized for this inhibition process, such as by not using ozone or oxygen plasma.

A Super hydrophobic surface remains on very edge of the substrate front side surface, but this remaining layer can be removed for downstream processing after processing of materials with a risk of creating defects (metal-containing material or other contaminants). Surfaces where chemically decomposed areas exist can be modified to be hydrophobic or hydrophilic to accommodate direct coating to improve adhesion, in place of existing vapor priming processes or surface passivation layers. Surface chemical reactions may be created by leveraging "click chemistry" reactions.

Figure 2:
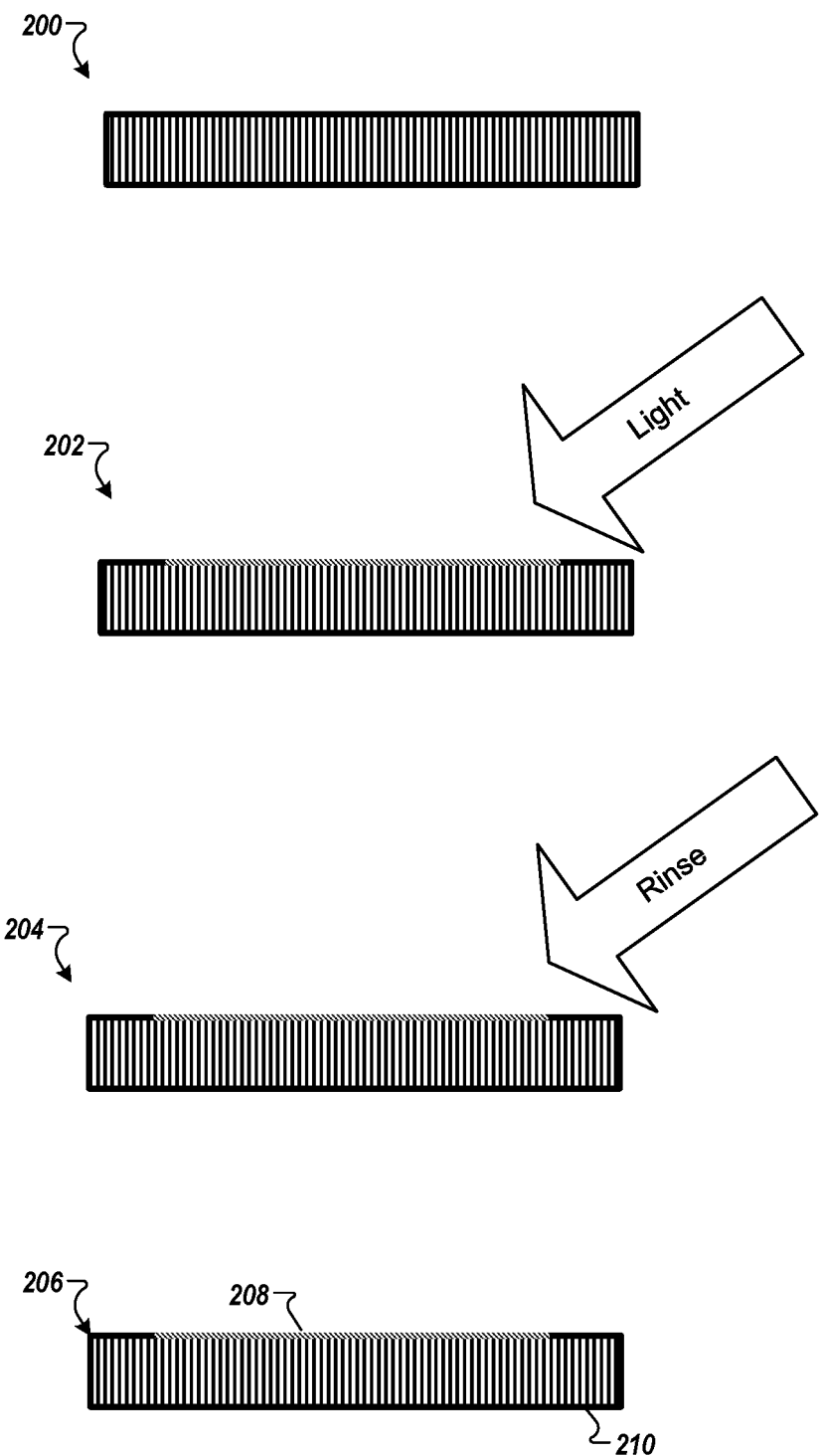
FIG. 2 is a schematic that shows a process flow according to one example.

FIG. 2 is a schematic that shows a process flow according to one example. At step 200, a monomer coating may be applied using vapor deposition from room temperature to a temperature of 300° C. in vacuum or atmosphere. The substrate 100 has an initial self-assembled monolayer (SAM) coating on the front side surface 102 of the substrate 100, the backside surface 104 of the substrate 100, and the side edge surface 106 of the substrate 100. The substrate 100 may be rinsed after vapor SAM attachment to remove any unbound polymer. Step 202 shows the substrate 100 after specific target areas are exposed to light. Then, the film may be developed in solvent or base as would be understood by one of ordinary skill in the art. This result in partial photo oxidation of the SAM molecules. Step 204 shows the substrate after the substrate 100 is rinsed to wash away any polar solvent. At step 206, the substrate 100 has two regions: a first region 208 and a second region 210. The first region 208 has improved coating. In the first region 208 (or exposed region), most of the polymer chain is removed and the remaining component is hydrophillic. No coating or deposition can occur in the second region 210 due to the blocking material type. SAM attachment results in areas with untouched SAM with alkane chain extending outwards in the second region 210. The second region 210 is hydrophobic. ALD/CVD deposition, solvent wetting, DIW wetting, and polymer adhesion are inhibited on the second region 210 (or non-exposed region).

Figure 3:
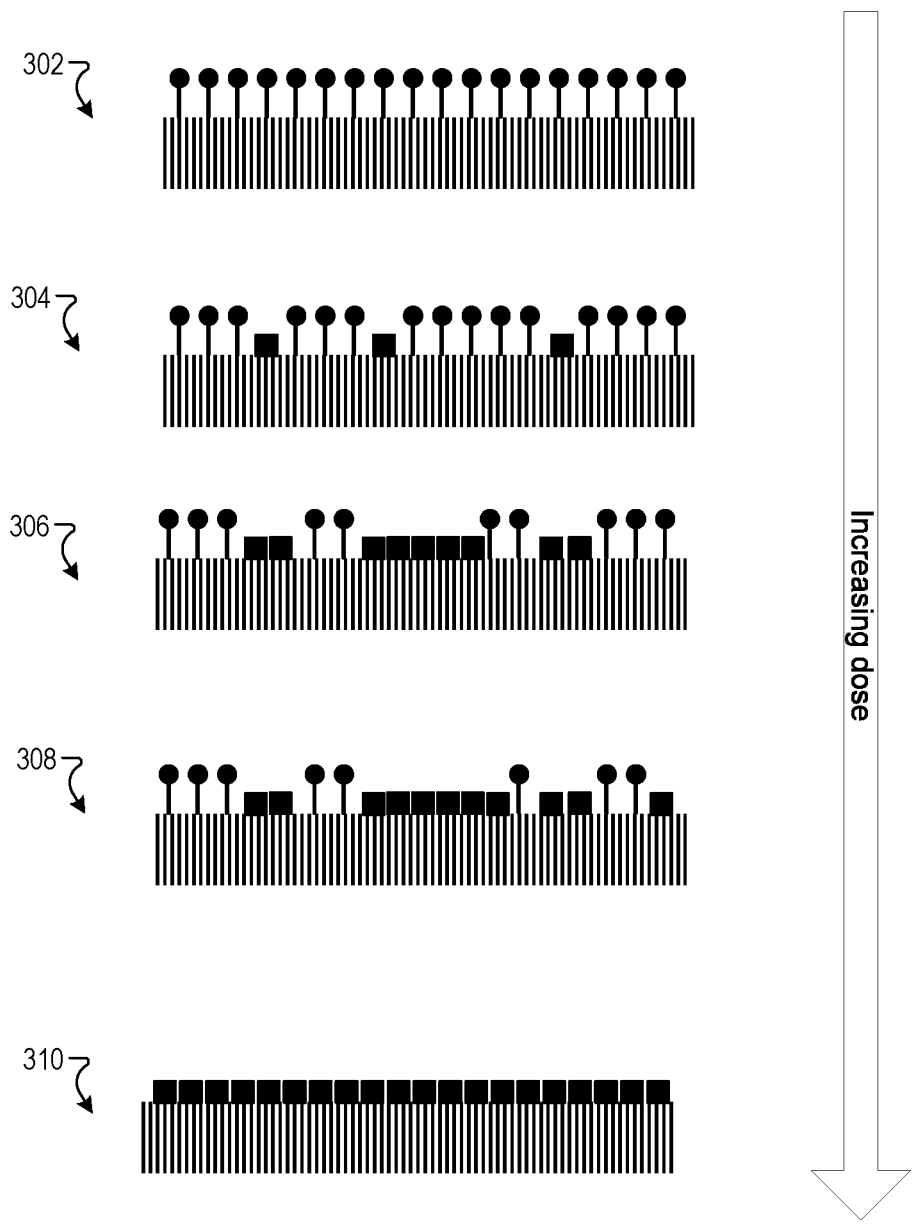
FIG. 3 is a schematic that shows a self-assembled monolayer (SAM) inhibition process flow according to one example.

FIG. 3 is a schematic that shows the SAM inhibition process flow according to one example. The exposure may be controlled using a control knob or the like. Controlling the exposure modulates the SAM loss which in turn correlates to a controllable nucleation inhibition or improved footing. As shown in steps 302-310, as the dose increases more SAM are inhibited and more atomic layer deposition (ALD) molecules are formed on the surface of the substrate 100.

Quantum efficiency may be low but this provides a linear process window to allow for controlled removal of SAM. The high dose/throughput may be matched to the deposition tool. Any of a range of wavelengths can be selected depending on monomer composition. In one example, the wavelength may be in the range of from 170 nm to 400 nm.

Figure 4:
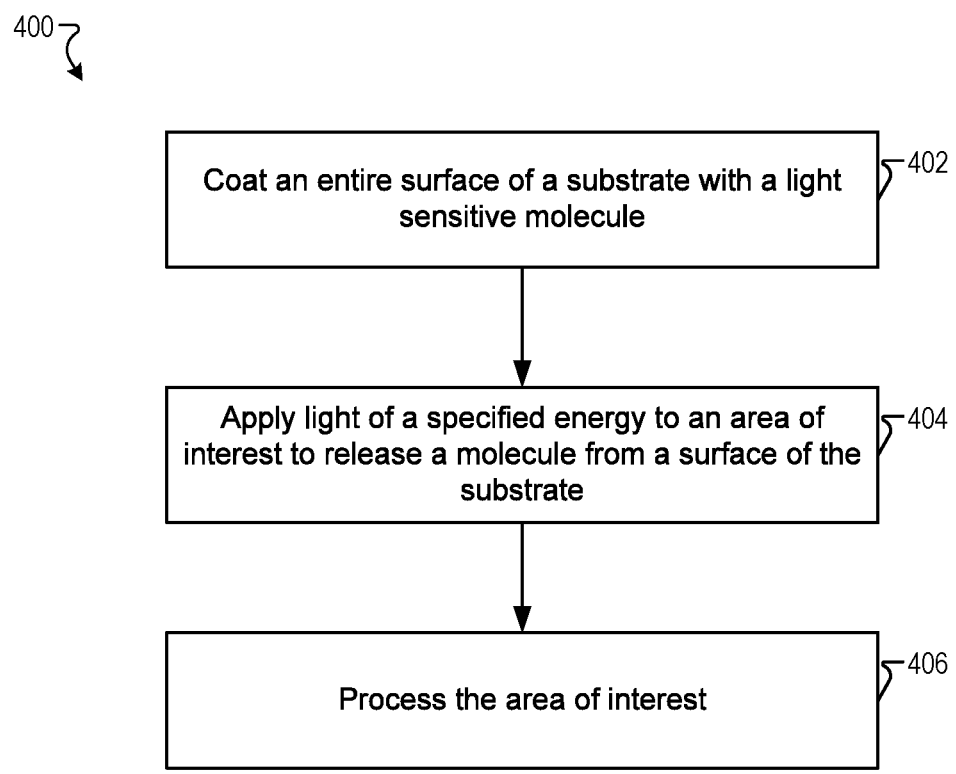
FIG. 4 is a flowchart for a method for inhibiting defectivity, metal particle contamination, and film growth on the substrate according to one example.

FIG. 4 is a flowchart for a method 400 for inhibiting defectivity, metal particle contamination, and film growth on the substrate according to one example. At step 402, a light sensitive molecule is attached to an entire surface of the substrate 100 by vapor deposition to create a superhydrophobic surface. For example, certain SAMs can be created as having a non-wetting surface, which prevents adhesion of liquids. Such surfaces can be described as being hydrophobic. Specifically, such surfaces can have a surface contact angle in a range that repels water or otherwise prevents adhesion of water and certain other liquids including some solvents.

At step 404, light of specified energy is applied to an area of interest or target area to release the molecule from the surface of the area of interest or the target area. Corresponding molecules decompose upon interaction with projected light.

At step 406, the area of interest is further processed as described further below. For example, photochemical or films (e.g., photoresist, BARC, organic planarization layer (OPL), metal-containing films, oxides, nitrides) may be applied to the surface where molecules are removed or fractured, photo chemicals or films. In locations where molecules are not removed, films and coatings will be rejected and will not adhere.

Figure 5:
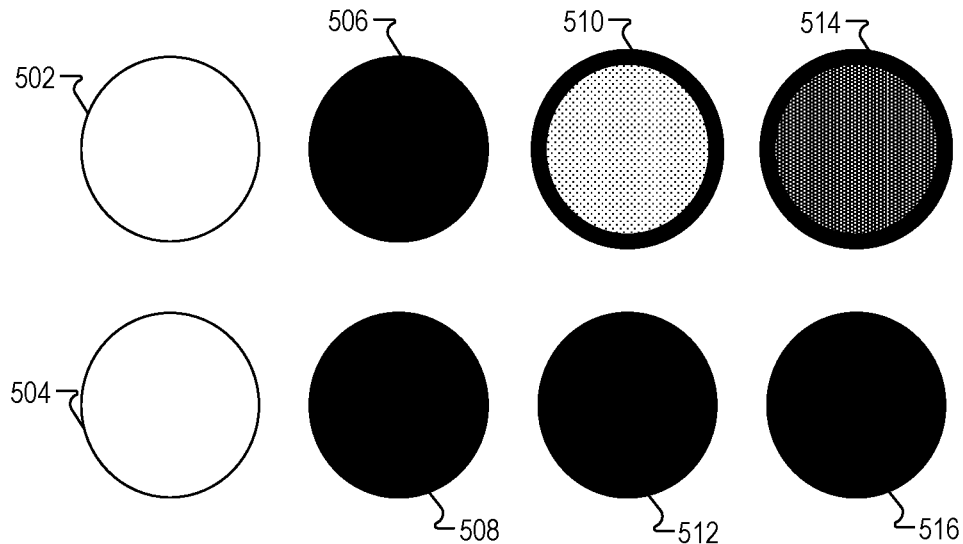
FIG. 5 is a schematic that shows an exemplary method for SAM removal according to one example.

FIG. 5 shows the front side surface and the backside surface of the substrate 100 at different steps of the process. 502 shows the front side surface of a silicon substrate and 504 shows the backside surface of the silicon substrate. In one embodiment, a Teflon-like SAM (self-assembled monolayer) containing a chromophore is applied in high density using the vapor deposition process that allows adhesion to the entire surface of the substrate or wafer. 506 and 508 show the front side surface and the backside surface of the substrate 100, respectively, after SAM deposition. The front side surface of the wafer, except for a peripheral edge that needs to be protected from metals and defects, can be exposed to actinic radiation as described later herein. 510 and 512 show the front side surface and the backside surface of the substrate after exposure. Exposing the SAM layer to radiation releases a portion of the molecule that was attached at the chromophore from adhesion to the surface and can be removed in vacuum or volatilized and removed. Subsequent coatings of metal containing material will not adhere to the wafer edge. In the case of spin cast metal containing material, droplets that remain can have a greater removal rate with standard semiconductor solvents or strong acids and bases without damaging the wafer surface. In the case of atomic layer deposition (ALD) deposited metal films, nitrides, oxides, and the like, the surface is passivated and the surface chemistry required for ALD type reactions will not occur in that location. Schematic 514 and 516 show the front side and backside surface of the substrate 100 after downstream processing.

In another embodiment, light projection hardware is used to deliver photon dose to the area of interest on the substrate (or wafer) (e.g., central region of the substrate) to photodecompose the self-assembled monolayer. An example material that can be selected is a 365 nm chromophore Nitrobenzyl group. In another example, a 266 nm chromophore selected has a Si—O—Si bond at wafer surface. The blocking (hydrophobic) SAM is vapor coated to an entire substrate, then a center portion is removed from the front of the wafer, leaving a ring around an edge portion of the wafer. Subsequently, downstream processes can be executed with top edge and bottom portions of the wafer being protected.

Subsequent coatings of metal containing material will not adhere to the wafer edge, as the material has not been modified in the unexposed locations (e.g., edge of the substrate). In the case of spin cast metal containing material, droplets that remain will be easily rinsed away with conventional semiconductor solvents. In the case of metal-containing films, the surface is passivated and the surface chemistry required for ALD type reactions will not occur in the unexposed region.

Figure 6:
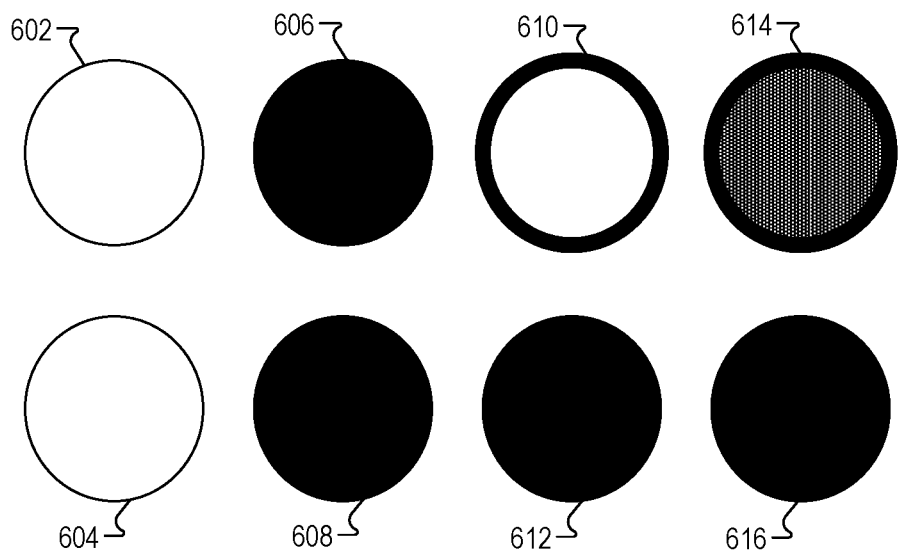
FIG. 6 is a schematic that shows another exemplary method for SAM removal according to one example.

In another embodiment, techniques described herein use light projection hardware to deliver photon dose to an area of interest to desorb the entire molecule in the area of interest (e.g., central region of the substrate). FIG. 6 is a schematic that illustrates the technique. 602 and 604 show the front side surface and the backside surface of the silicon substrate. 606 and 608 illustrates the front side surface and the backside surface with the vaper coated blocking SAM layer. 610 shows the area of interest or target area exposed to a 266 nm light. 612 shows the backside surface of the substrate that is not exposed to the 266 nm light. Subsequent coatings of metal containing material will not adhere to the wafer edge, as the material has not been desorbed from the unexposed regions as shown by 614 and 616. In the case of spin cast metal-containing material, droplets that remain will be easily rinsed away with conventional semiconductor solvents, whereas in the case of metal-containing films, the surface is passivated and the surface chemistry required for ALD type reactions will not occur in the unexposed region.

In another embodiment, techniques described herein use a sacrificial layer of material such as a non-crosslinked photoresist, BARC, or thin film polymer to block a center portion of a wafer up to an edge area. The method includes first selectively depositing or forming a sacrificial polymer layer prior to coating the wafer with a blocking SAM. Referring to FIG. 3, a sacrificial polymer layer is formed in a device region of a substrate. This device region can be a working surface of a wafer when semiconductor devices are formed. Basically, a circular area slightly smaller than a diameter of the front side surface of the substrate. A diameter of the sacrificial polymer layer can be a couple of millimeters to a couple of centimeters smaller than the diameter of the front side surface of the substrate. The sacrificial polymer layer essentially functions to prevent a hydrophobic SAM from being coated in that area.

When a vapor coating deposition of a blocking SAM is executed, the monomer coating is applied to all surfaces of the substrate except for a region containing the sacrificial polymer. The SAM is essentially coated on a backside surface, a side edge surface, and an outer ring of the front side surface. The sacrificial polymer layer can then be removed, leaving the SAM protecting areas of the substrate except for an active device forming area.

Figure 7:
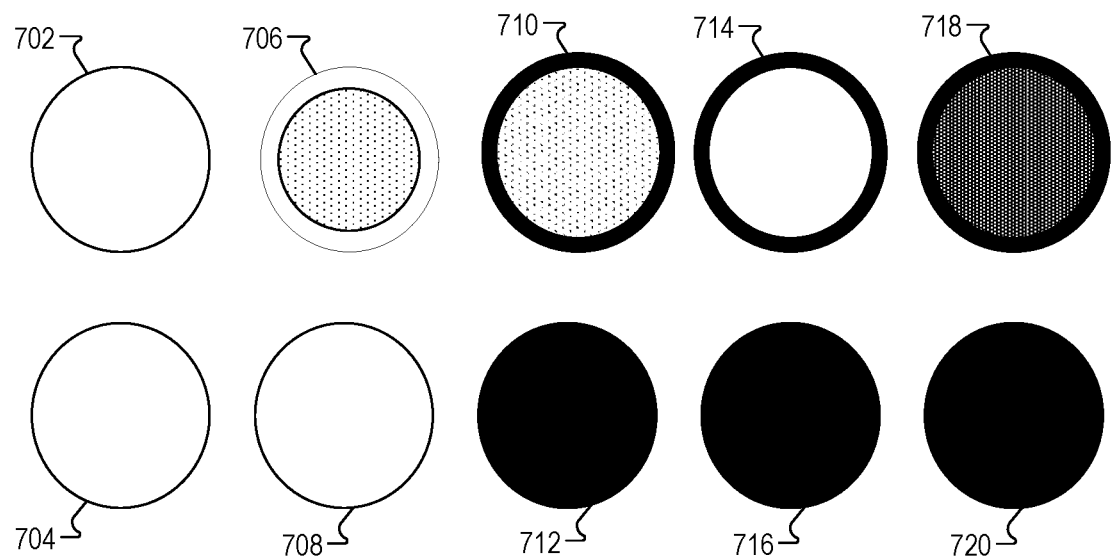
FIG. 7 is a schematic that shows another exemplary method for SAM removal according to one example.

FIG. 7 is a schematic that illustrates the steps of the technique described below. 702 and 704 show the front side surface and the backside surface of a silicon substrate, respectively. 706 and 708 show the front side surface and the backside surface of the substrate after the sacrificial polymer layer is deposited or formed on the substrate. As shown in FIG. 7 (706), only a target area is covered by the sacrificial polymer layer. The remaining, unblocked edge surface (beyond 145 nm, depending on chip manufacturer) is treated with a Teflon-like photo-responsive SAM to prevent coating adhesion and/or film formation. 710 and 712 show the front side surface and the backside surface of the substrate after the treatment with the SAM. The sacrificial polymer in the wafer center portion is then removed using a solvent wet-strip, leaving behind the coating-resistive. 714 shows the front side surface of the substrate after the sacrificial polymer layer is removed. SAM surface at the very edge portion of the working surface. Subsequent coatings of metal-containing material will not adhere to the wafer edge as shown in 718. In addition subsequent coating will not adhere to backside surface of the substrate as shown by 716 and 720. In the case of spin cast metal-containing material, droplets that remain can be easily rinsed away with conventional semiconductor solvents. In the case of metal-containing films, the surface is passivated and the surface chemistry required for ALD type reactions will not occur in that location.

After selective chromophore removal or modification, several options are available for subsequent processing. One embodiment includes removing a non-stick portion of a molecule (SAM), and then use remaining material as adhesion promotor instead of HIVIDS chemistry. A given non-stick click molecule can be replaced with a different termination to modify a surface contact angle for improved developer floor release. The entire molecule at silicon surface in exposed areas can be removed. A highly selective chemistry (Si-containing chemistry, metal oxide, TEOS-like) can be changed to behave as etch hardmask. Also, a wafer adsorbing portion of the molecule may be cross-linkable in 365 nm for high temperature applications after removal of a coat-blocking portion.

Figure 8:
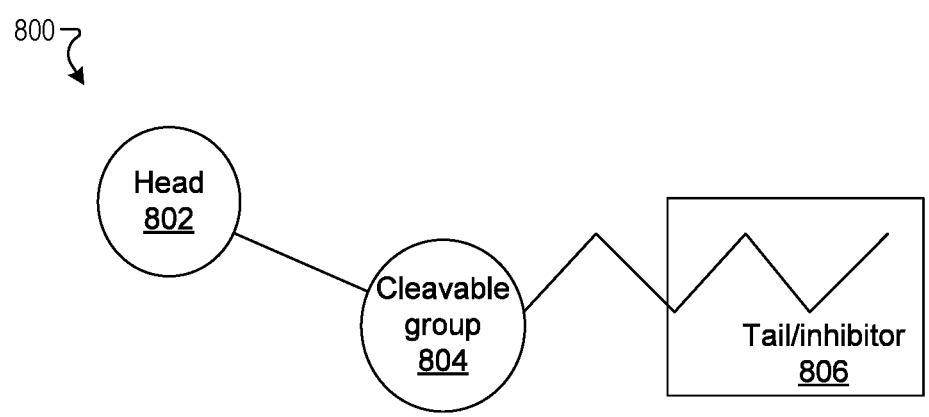
FIG. 8 is a schematic that shows an exemplary structure of a SAM material according to one example.

Note that various materials can be used for executing techniques herein. FIG. 8 shows example materials that can be used herein. SAMs 800 are organized assemblies of molecules disposed at an interface between two phases of matters. An example SAM/molecule 800 design can have a head 802 (or head group), a cleavable group 804, and a tail/inhibitor 806 (or tail group). The head 802 is oriented towards the interface, and the tail 806 is oriented away from the interface.

The head group 802 may be any suitable chemical including Trichloro-Mono-Hydroxy-dithiolane. The cleavable group 804 may be Nitrobenzyl based, Carbonyl based, or Benzyl based. The cleavable group 804 may be selected based on the wavelength.

The tail group 806 may be a relatively long inert, linear hydrocarbon moiety. The tail group 806 includes a fully or partially fluorinated hydrocarbon chain that is oriented away from the interface. The tail group 806 may include alkanes 2-30 carbon long. The tail group 806 may include additional branching and have different shapes.

A length of a deposited SAM precursor molecule can vary by application and can dictate or control the thickness (height) of the networked solid on the substrate. For some applications a thickness of 0.5 nm to 1.5 nm is preferable.

Figure 9:
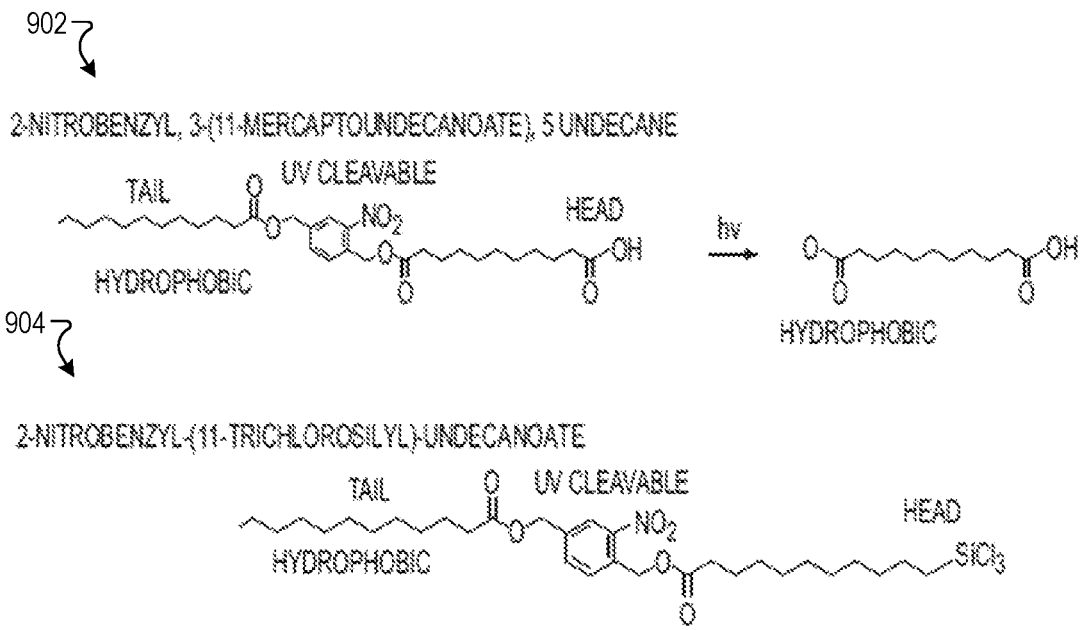
FIG. 9 is a schematic that shows a hydrocarbon chain SAM layers according to one example.

FIG. 9 further illustrates exemplary molecules that can be used herein. Molecules 902 and 904 are hydrocarbon chains. Molecule 902 shows the structure of 2-nitrobenzyl, 3-(11-mercaptoundecanoate), 5 undecane. Molecule 904 is 2-nitrobenzyl-(11-trichlorosilyl)-undecanoate.

Figure 10:
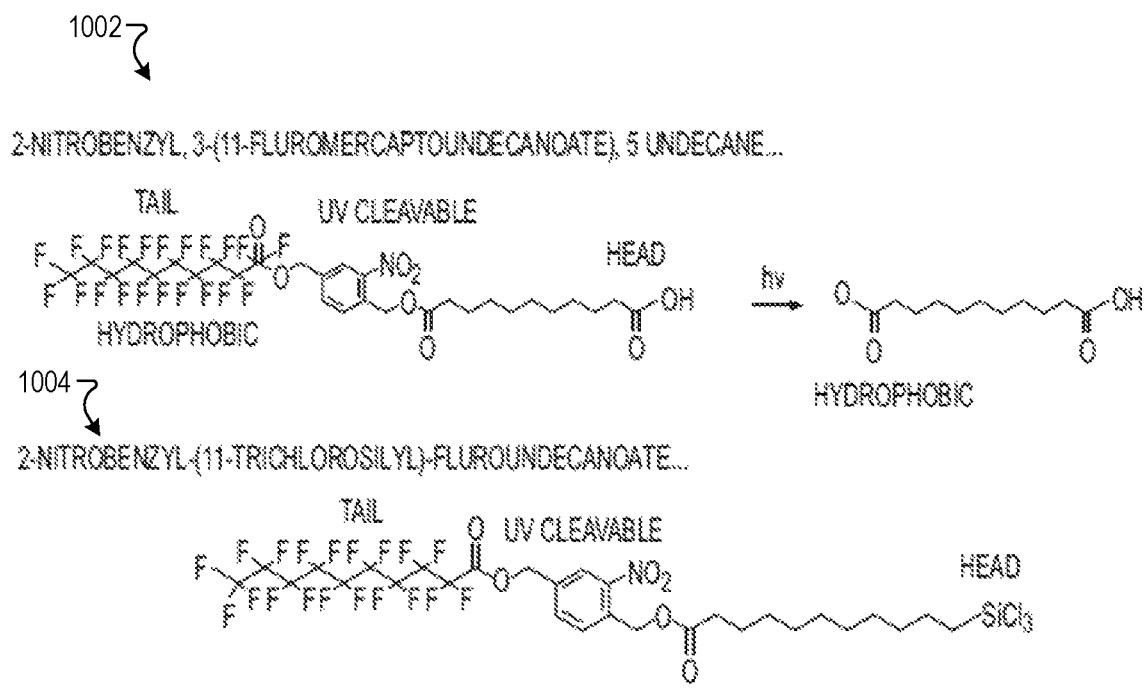
FIG. 10 is a schematic that shows a fluorinated chain SAM layers according to one example.

FIG. 10 further illustrates exemplary molecules that can be used herein. Molecules 1002 and 1004 show examples of fluorinated chain. In particular, molecule 1002 is 2-nitrobenzyl, 3-(11-fluromercaptoundecanoate), 5 undecane. Molecule 1004 is 2-nitrobenzyl-(11-trichlorosilyl)-flurounde-canoate.

In one example, 2-nitrobenzyl 11-(trichlorosilyl) undecanoate may be synthesised as described below. The reaction is preferably carried out under dark conditions. For example, an aluminium foil may be used to exclude light from the reaction.

In a first step, 2.0 g (9.9 mmol) of undec-10-enoyl chloride was added to a solution of 1.68 g (10.9 mmol) of (2-nitrophenyl) methanol. The (2-nitrophenyl) methanol solution is obtained by dissolving the methanol in a mixture of 0.88 ml (10.9 mmol) of pyridine and 40 ml of dichloromethane. The reaction was stirred for 48 hours at ambient temperature until a complete conversion was observed. The organic layer was extracted with 3×20 mL of 5% hydrochloric acid solution to remove excess pyridine and 20 mL of saturated sodium bicarbonate solution, then dried over sodium sulphate. The solvent was removed in a vacuum and subsequently a column separation using cyclohexane/ethyl acetate (8:1) for product purification was performed. 2.63 g of white soled was obtained in 83% of theoretical yield.

In a second step, 1.0 g (7.4 mmol) of trichlorosilane was added to a solution of 1.0 g (3.1 mmol) of (2-nitrobenzy-lundec-10-enoate, dissolved in 5 ml of dichloromethane. As catalyst hexachloroplatinic acid was used. The reaction was stirred for 24 hrs at ambient temperature until a complete conversion was observed.

Exemplary yield: 1.38 g of a white, yellowish liquid (97.3% of theoretical yield).

In other embodiments, hyper-branched carbon materials can be used that function as hydrophobic materials as well as fluorinated materials.

In other embodiments, a bi-functional light-reactive chromophore can be used. A two-photon deprotection can be achieved with a 780 nm laser, which provides access to near-field induced patterning.

One embodiment includes a method of processing a substrate. A substrate (such as a silicon wafer) can be received or transferred into a processing chamber. The substrate has a front side surface, a backside surface, and a side edge surface. The substrate can include bevel edges, notches, et cetera. The front side surface, the backside surface, and the side edge surface are coated with a self-assembled monolayer. The self-assembled monolayer is hydrophobic (or at least has an initial state that is hydrophobic). Note that subsequent processing of the substrate and exposure to other chemicals and species can degrade, change, or modify this initial surface energy to a second surface energy that may be more or less hydrophobic. The self-assembled monolayer can be a fluorinated material, a hyper-branched carbon-containing material, or other hydrophobic material.

A central region of the front side surface is exposed with actinic radiation. The central region has a surface area that is less than a surface area of the front side surface. The actinic radiation causing a de-protection reaction with the self-assembled monolayer within the central region. For example, the self-assembled monolayer can include a chromophore or other additive that is reactive to a predetermined light wavelength. The self-assembled monolayer is then removed from the central region of the front side surface while the self-assembled monolayer remains on remaining surfaces of the substrate. In other words, an entire wafer is coated with a hydrophobic film, and then this film is selectively removed from a portion of a working surface leaving a ring of hydrophobic material on the edge of the working surface.

With the central region uncovered and remaining portions of the substrate covered with a hydrophobic coating, additional processing can be continued. For example, a metal-containing film can be deposited on the substrate by spin-on deposition. This results in the metal-containing film adhering to the uncovered central region, but without adhering (or fully adhering) to surfaces coated with the self-assembled monolayer.

In other embodiments, the substrate can first have a sacrificial film formed on an interior region of the substrate, for example, leaving a perimeter of the working surface uncovered by the sacrificial film. This sacrificial film can be selected to optionally prevent adhesion of a self-assembled monolayer or accept adhesion of a self-assembled monolayer. If a given sacrificial film used prevents adhesion of the self-assembled monolayer, then the entire substrate can be coated with the SAM which coats other surfaces but fails to adhere to the sacrificial film. The sacrificial film can then be removed uncovering the interior region of the working surface. Alternatively, if a given sacrificial film is used that accepts adhesion of the SAM, then the self-assembled monolayer that is hydrophobic is coated on all surfaces of the substrate, including the sacrificial film. Subsequently, the sacrificial film is removed, or lifted off the substrate, which in the process removes self-assembled monolayer material that was adhered to the sacrificial film. This results in the interior region no longer being covered by the sacrificial film or the self-assembled monolayer while remaining surfaces of the substrate remain covered with the hydrophobic material.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of processing a substrate, the method comprising:
   receiving a substrate, the substrate having a front side surface, a backside surface, and a side edge surface;
   coating the front side surface, the backside surface and the side edge surface with a self-assembled monolayer (SAM);
   exposing an area of interest with actinic radiation, the actinic radiation causing a de-protection reaction within the self-assembled monolayer within the area of interest; and
   removing the self-assembled monolayer from the area of interest while the self-assembled monolayer remains on remaining surfaces of the substrate.

2. The method of claim 1, wherein the self-assembled monolayer is a fluorinated material.

3. The method of claim 1, wherein the self-assembled monolayer is a hyper-branched carbon-containing material.

4. The method of claim 1, wherein the self-assembled monolayer is coated by vapor deposition.

5. The method of claim 1, further comprising:
   depositing a metal-containing film on the substrate by spin-on deposition, the metal-containing film failing to fully adhering to surfaces coated with the self-assembled monolayer.

6. The method of claim 1, wherein the self-assembled monolayer includes a chromophore reactive to a predetermined light wavelength.

7. The method of claim 1, wherein the substrate can further include bevel edge surfaces.

8. The method of claim 1, wherein the area of interest is an interior region of the front side surface, the interior region extending from a center point of the front side surface to an edge region of the front side surface, the edge region of the front side surface being an annular region extending from a perimeter of the front side surface to a predetermined distance towards a center point of the front side surface.

9. The method of claim 1, wherein the area of interest is a central region of the front side surface, the central region having a surface area that is less than a surface area of the front side surface.

10. The method of claim 1, wherein the self-assembled monolayer has an initial state that is hydrophobic.

11. The method of claim 1, wherein exposing the area of interest with actinic radiation includes delivering a photo dose to the area of interest.

12. The method of claim 11, wherein a wavelength of the actinic radiation is 266 nm or 365 nm.

13. The method of claim 11, wherein the photo dose desorbs the SAM in the area of interest.

14. The method of claim 1, further comprising:
   removing a non-stick portion of the SAM; and
   using a remaining portion of the SAM as an adhesion promotor.

15. A method of processing a substrate, the method comprising:
   receiving a substrate, the substrate having a front side surface, a backside surface, and a side edge surface;
   coating a target region of the front side surface with a sacrificial film, the sacrificial film having a surface that prevents adhesion of specific materials to the target region;
   coating the front side surface, the backside surface and the side edge surface with a self-assembled monolayer, the self-assembled monolayer failing to adhere to the sacrificial film, the self-assembled monolayer being hydrophobic; and removing the sacrificial film from the target region of the front side surface.

16. The method of claim 15, wherein the target region is a central region having a surface area that is less than a surface area of the front side surface.

17. A method of processing a substrate, the method comprising:

receiving a substrate, the substrate having a front side surface, a backside surface, and a side edge surface;

coating a target region of the front side surface with a sacrificial film;

coating the front side surface, the backside surface and the side edge surface with a self-assembled monolayer, the self-assembled monolayer being hydrophobic; and removing the sacrificial film from the target region of the front side surface, wherein removing the sacrificial film also removes the self-assembled monolayer that was attached to the sacrificial film resulting in the target region being free from the self-assembled monolayer.

18. The method of claim 17, wherein the target region is a central region of the front side surface having a surface area that is less than a surface area of the front side surface.

19. The method of claim 17, wherein the self-assembled monolayer is coated by vapor deposition.

20. The method of claim 17, wherein the self-assembled monolayer is a fluorinated material.

* * * * *